United States Patent
Dickerson et al.

(10) Patent No.: US 6,421,535 B1
(45) Date of Patent: Jul. 16, 2002

(54) SUPERREGENERATIVE CIRCUIT

(75) Inventors: Roger Dickerson, Loveland; Jimmy Chess, Goshen; Jack Lorthioir, Westchester, all of OH (US)

(73) Assignee: Xetron Corporation, Cincinnati, OH (US)

( * ) Notice: Subject to any disclaimer, the term of this patent is extended or adjusted under 35 U.S.C. 154(b) by 0 days.

(21) Appl. No.: 09/310,220

(22) Filed: May 12, 1999

(51) Int. Cl.[7] .................................................. H04B 1/16
(52) U.S. Cl. ..................... 455/338; 455/336; 455/215; 333/109
(58) Field of Search ................................ 455/215, 336, 455/338, 339; 333/109

(56) References Cited

U.S. PATENT DOCUMENTS

| | | | | |
|---|---|---|---|---|
| 3,746,999 A | * | 7/1973 | Freen | 455/334 |
| 4,393,514 A | * | 7/1983 | Minakuchi et al. | 455/336 |
| 4,614,945 A | | 9/1986 | Brunius et al. | 340/870.03 |
| 4,679,010 A | * | 7/1987 | Bahl | 333/109 |
| 4,749,964 A | | 6/1988 | Ash | 331/107 |
| 4,786,903 A | | 11/1988 | Grindahl et al. | 340/825 |
| 4,799,059 A | | 1/1989 | Grindahl et al. | 340/870.03 |
| 4,876,700 A | | 10/1989 | Grindahl | 375/87 |
| 4,963,945 A | * | 10/1990 | Cooper et al. | 333/109 |
| 5,029,271 A | * | 7/1991 | Meierdierck | 329/347 |
| 5,105,162 A | * | 4/1992 | Fleissner et al. | 329/359 |
| 5,448,230 A | | 9/1995 | Schanker et al. | 340/870.03 |
| 5,553,094 A | | 9/1996 | Johnson et al. | 375/200 |
| 6,034,603 A | * | 1/1997 | Steeves | 340/572.1 |
| 5,609,154 A | * | 3/1997 | Oppelt et al. | 600/453 |
| 5,621,756 A | * | 4/1997 | Bush et al. | 375/219 |
| 5,630,216 A | * | 5/1997 | McEwan | 455/215 |
| 5,673,252 A | | 9/1997 | Johnson et al. | 370/94.1 |
| 5,751,197 A | * | 5/1998 | Boling, III | 331/107 |
| 5,946,609 A | * | 8/1999 | Morey | 455/336 |
| 6,225,874 B1 | * | 5/2001 | Kerley | 333/109 |

* cited by examiner

Primary Examiner—Dwayne Bost
Assistant Examiner—Ray B Persino

(57) ABSTRACT

A superregenerative circuit which is operable in a transmit mode and a receive mode of operation. A superregenerative oscillator and a single antenna are functional in both modes. To minimize any undesired RF energy which may be radiated during the receive mode of operation, the circuitry includes decoupling means connected between the antenna and the oscillator.

During reception, the oscillator is periodically quenched, and received signals are recovered by circuitry which obtains, during unquenched periods, time samples indicative of the time required for the RF energy to build up to a predetermined level in the oscillator circuit.

8 Claims, 7 Drawing Sheets

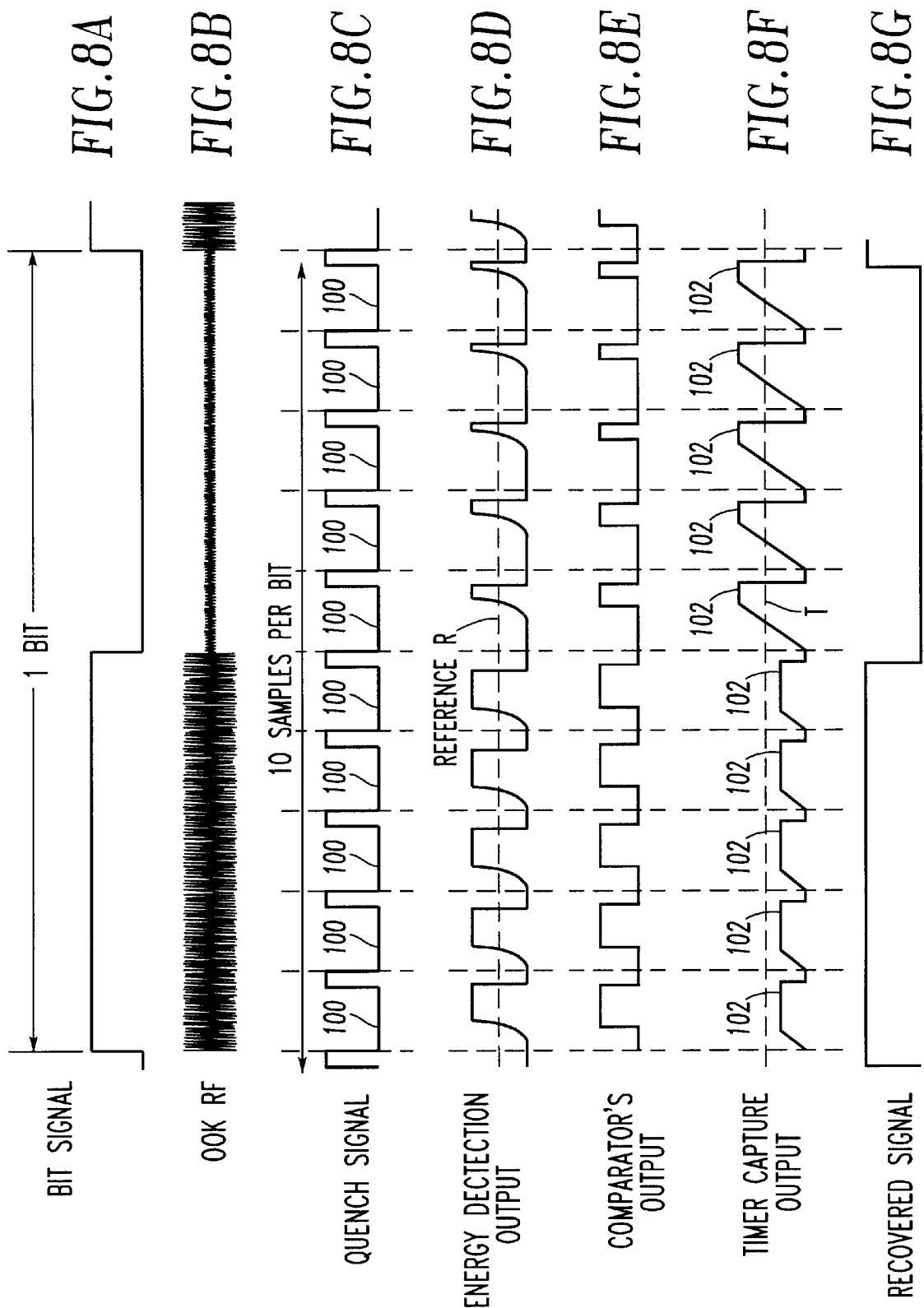

SUPERREGENERATIVE CIRCUIT

BACKGROUND OF THE INVENTION

1. Field of the Invention

The invention in general relates to RF circuitry, and more particularly to an improved superregenerative receiver which may also be operated as a transmitter.

2. Description of Related Art

Superregenerative receivers are often utilized in applications requiring small size, low power consumption and inexpensive circuitry. For example, superregenerative receivers find utility in small beacons, transponders, toys and remote control applications, to name a few.

In one information transfer arrangement, a plurality of RF modems are utilized, in conjunction with respective host devices, to effect the information transfer. An improved such arrangement is more fully described and claimed in copending patent application Ser. No. 09/310,219, filed May 12, 1999, assigned to the same assignee as the present invention and hereby incorporated by reference. The RF modems described therein employ a superregenerative circuit as a receiver and, preferably, as a transmitter as well.

It is known that the radiation of any superregenerative receiver, when in the receive mode, is quite substantial, so that as a consequence, interference problems may be experienced if several devices must operate in the vicinity of one another. In addition, various such superregenerative circuits do not necessarily faithfully reproduce the received signal.

The present invention provides an improved superregenerative circuit which is relatively small and inexpensive, with reduced power consumption, and can be utilized in an environment wherein a plurality of such circuits are simultaneously operating. Further, a sampling of the received signal in accordance with an improved technique, results in a more accurate representation of the received signal.

SUMMARY OF THE INVENTION

An RF superregenerative circuit is provided which is operable as a receiver as well as a transmitter of RF signals. The circuit includes a superregenerative oscillator having an amplifier, a resonant circuit arrangement connected to the output of the amplifier and feedback means connecting the resonant circuit arrangement with the input of the amplifier. Circuit means are provided for controlling the oscillatory condition of the oscillator. A signal decoupling means is connected in circuit between the oscillator and an antenna means and is operable to minimize any RF energy radiated by the superregenerative circuit, via the antenna means, when in the receive mode of operation.

BRIEF DESCRIPTION OF THE DRAWINGS

FIG. 8 shows waveforms illustrating the recovery of binary bit information.

DESCRIPTION OF THE PREFERRED EMBODIMENT

Figure 1:
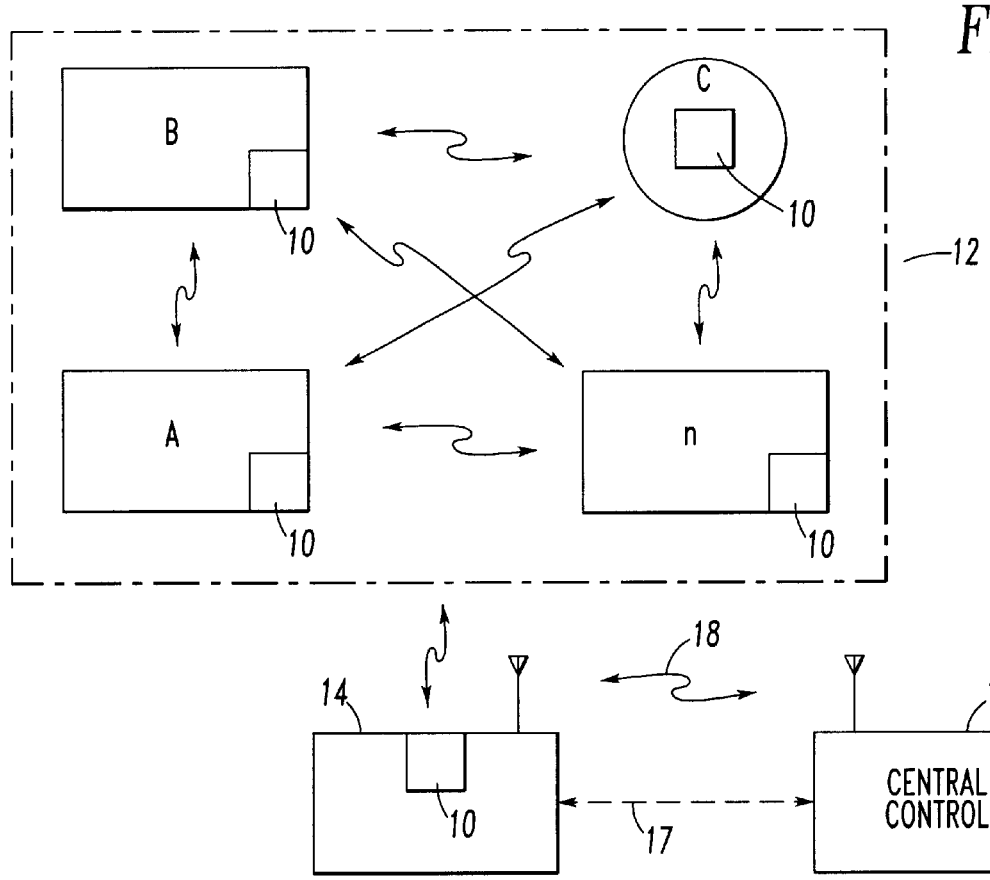
FIG. 1 is a block diagram of a system which utilizes the superregenerative circuit of the present invention.

In the drawings, which are not necessarily to scale, like or corresponding parts are denoted by like or corresponding reference numerals.

The superregenerative circuit of the present invention finds utility in a variety of devices, and will be described, by way of example, with respect to the system illustrated in FIG. 1. In FIG. 1, a plurality of host devices A, B, C . . . n each include an identical RF modem 10, mounted internally or externally, whereby the host devices can communicate with one another to transfer information which has been entered into the host device such as by a scanning wand, keypad, keyboard, wire input, or the like. The host devices A, B, C . . . n, which may be identical, dissimilar or a combination of like and different designs, constitute an array 12.

The information contained in one or more host devices may be transferred to a remote location such as intermediate unit 14, which also includes an RF modem 10. Depending upon the application, the intermediate unit 14 may be additionally operable to communicate with a distant central control 16 either by telephone or other hardwire connection, or by RF communication, as indicated by respective links 17 and 18. For example, the host devices may be part of a parcel delivery system to automate the task of parcel tracking and delivery. In such system, the intermediate unit 14 may be a delivery truck, and delivery or pick-up of a designated parcel may be instantly recorded at the central control location 16.

Figure 2:
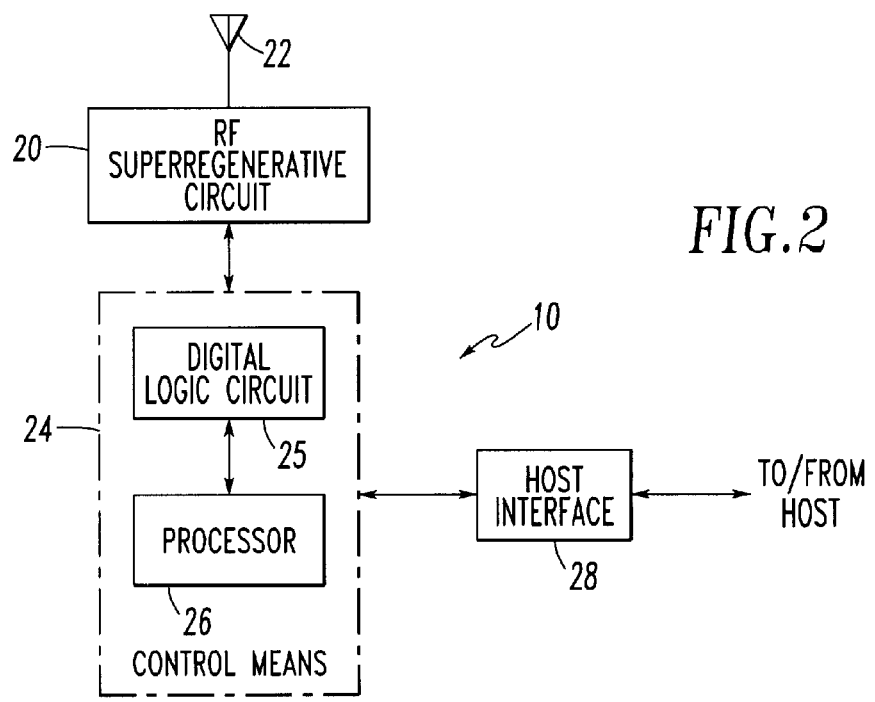
FIG. 2 is a block diagram of the modem of FIG. 1.

An overall block diagram of an RF modem of FIG. 1 is illustrated in FIG. 2. The RF modem 10 includes an RF section for the actual transmission and reception of RF energy, modulated by the information to be transferred. The RF section is constituted by a superregenerative circuit 20 which transmits and receives the RF energy via a single antenna 22. A superregenerative circuit 20 is utilized in view of its low cost, low power consumption, simplicity, good sensitivity, small size and low component count.

Operation of the superregenerative circuit 20 is governed by a control means 24 which may be a fast microprocessor or, as illustrated, may be a combination of a digital logic circuit 25 and processor 26. The digital logic circuit 25 is an ASIC (application specific integrated circuit), while the processor 26 may be an inexpensive off the shelf item such as Atmel corporation's RISC microcontroller model AT90S8515.

The RF modem 10 is resident in a host device and information which is to be transmitted from that host device to another host device is transferred by a signal transfer means in the form of host interface 28. Similarly, certain received information is placed into the host device also via the host interface 28.

Figure 3:
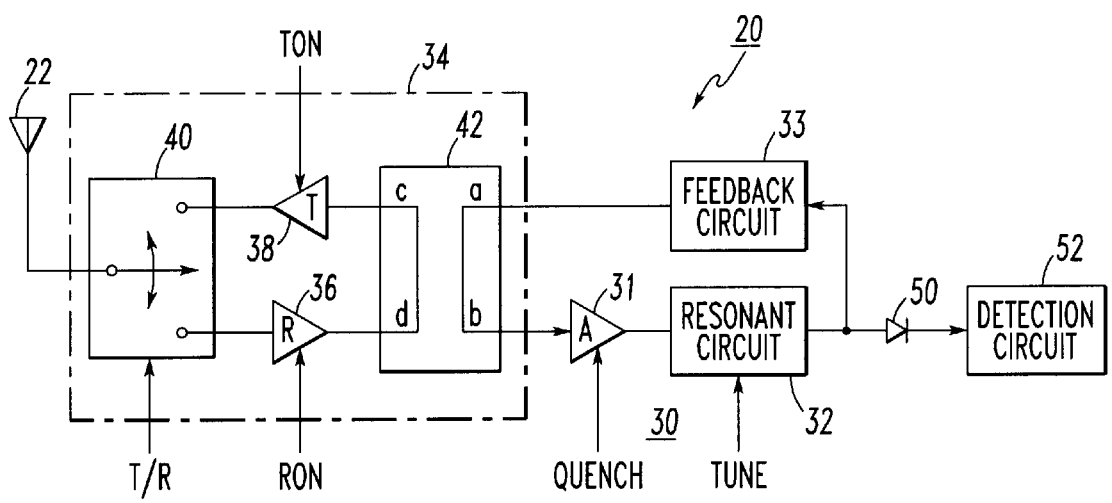
FIG. 3 illustrates the RF superregenerative circuit of FIG. 2 in more detail.

The superregenerative circuit 20 is illustrated in more detail in FIG. 3, and includes a superregenerative oscillator 30 comprised of an amplifier 31 and resonant circuit arrangement 32, the output of which is coupled back to the input of amplifier 31 via a feedback loop which includes feedback circuit 33. The superregenerative circuit 20, in conjunction with the antenna 22 serves as an RF receiver in which oscillations, at a frequency determined by the resonant circuit 32, are allowed to build up but are periodically shut down by means of a control signal known as a quench signal. In FIG. 3 a QUENCH signal, by way of example, is applied to the amplifier 31 and when the signal is asserted, for example, in a high state, it will turn off the amplifier and cause the cessation of oscillations, and when deasserted, that is, placed in a low state, it will establish conditions conducive for oscillations. Such QUENCH signal alternatively may be applied to the resonant circuit arrangement 32 to decrease its quality factor Q, to establish oscillatory and non-oscillatory conditions.

In a scenario wherein relatively few host devices are used, the resonant circuit arrangement 32 may be set for a fixed frequency. However, in a preferred embodiment, to allow for a larger plurality of host devices, the resonant circuit arrangement 32 is tunable to a plurality of different frequencies by means of a TUNE signal. For example, with four different TUNE signal voltages the superregenerative receiver can operate on four different frequencies representing four different channels. Such frequencies may be closely spaced and may be selected from the 2.4 GHz, or other ISM (Industrial, Scientific, Medical) band, by way of example.

As a cost and space saving measure, the superregenerative circuit 20 is also operable as the transmitter for the RF modem 10. Binary information is transmitted and the preferred modulation technique, when operating as a transmitter, is On/Off Keying wherein the amplifier 31 is turned on for a predetermined period of time to transmit a binary 1 and is simply turned off for a predetermined period of time to represent a binary 0.

When operating as a receiver, oscillator reradiation is of a concern in that the superregenerative circuit 20 while receiving can simultaneously transmit and cause interference with other host devices. To minimize this effect, decoupling means 34 is provided between the antenna 22 and the amplifier 31.

The decoupling means 34 includes a receive path having a receive amplifier 36 which is placed into operation by means of signal RON, and a transmit path having a transmit amplifier 38 which is placed into operation by means of signal TON. An electronically operated transmit/receive switch 40, in response to signal T/R, will selectively connect the antenna 22 to the receive amplifier 36 when listening for RF information signals and will connect the antenna 22 to the transmit amplifier 38 when information is to be transmitted.

Further decoupling is accomplished with the provision of a directional coupler 42 having port a connected to the feedback circuit 33, port b connected to the input of amplifier 31, port c connected to the input of transmit amplifier 38 and port d connected to the output of receive amplifier 36.

Figure 3A:
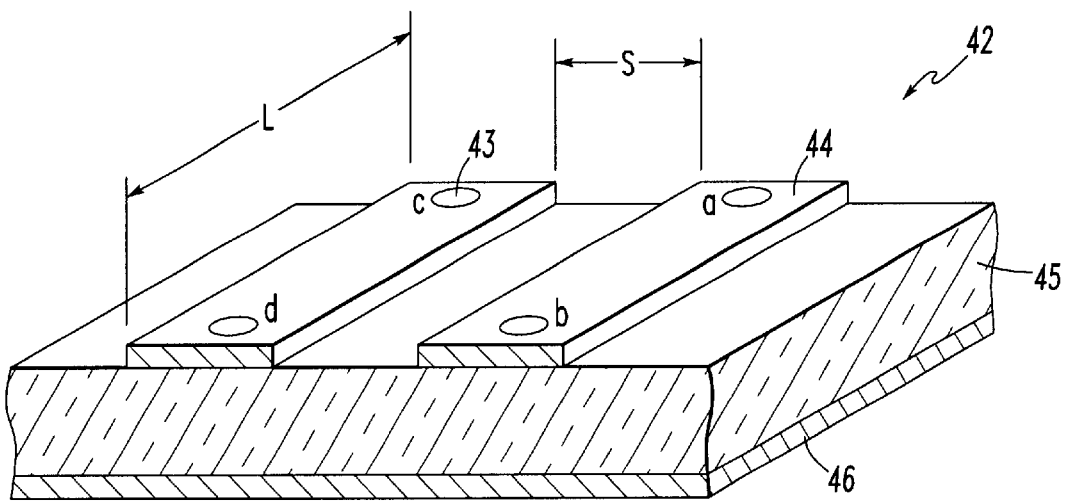
FIG. 3A shows one type of signal coupling arrangement used in FIG. 3.

One type of directional coupler which may be utilized is further illustrated in FIG. 3A. The directional coupler 42 illustrated in FIG. 3A is a 4-port 90° hybrid splitter which includes microstrip lines 43 and 44 having respective terminals a, b, c and d corresponding to those illustrated in FIG. 3. The microstrip lines 43 and 44, positioned upon a dielectric substrate 45 having a ground plane 46, are each of a length L and are spaced apart by a distance S, where S determines the coupling factor and L is a quarter wavelength ($\lambda/4$) at the operating frequency. If the superregenerative circuit is designed for operation at a plurality of different closely spaced frequencies, satisfactory operation of the directional coupler may be obtained if L is selected to be $\lambda/4$ at one of the operating frequencies or at a geometric mean of all of the, contemplated operating frequencies.

With reference once again to FIG. 3, the directional coupler 42 is operative such that any input signal appearing at port d from the output of receive amplifier 36 is coupled to port b, the input of amplifier 31, with relatively low loss, and to port a with relatively high loss. In a similar fashion, the signal in feedback circuit 33 is strongly coupled to port c, the input to transmit amplifier 38, with no or minimal signal being coupled to port d. Therefore, during signal reception a minimal amount of power flows back through receive amplifier 36 and switch 40 to the antenna 22. The power that is coupled to transmit amplifier 38 will cause insignificant radiation due to the fact that transmit amplifier 38 is off and switch 40 is an open circuit for the transmit path.

The superregenerative circuit 20 includes a diode detector 50 which in the receive mode of operation samples the oscillator 30 output voltage and is coupled to a utilization means such as detection circuit 52, wherein certain time measurements are made to recover the transmitted information.

More particularly, when the QUENCH signal is low and the circuit is allowed to oscillate, the oscillation amplitude will build up. If RF energy at the oscillator frequency, representing a binary 1, is received from another host, the oscillations will reach a certain magnitude in a relatively short period of time. If no RF energy signal is received, oscillations will still occur simply due to thermal noise which is always present. These latter oscillations, however, will build up to the certain magnitude in a relatively longer period of time. This operation is illustrated in FIG. 4.

Figure 4:
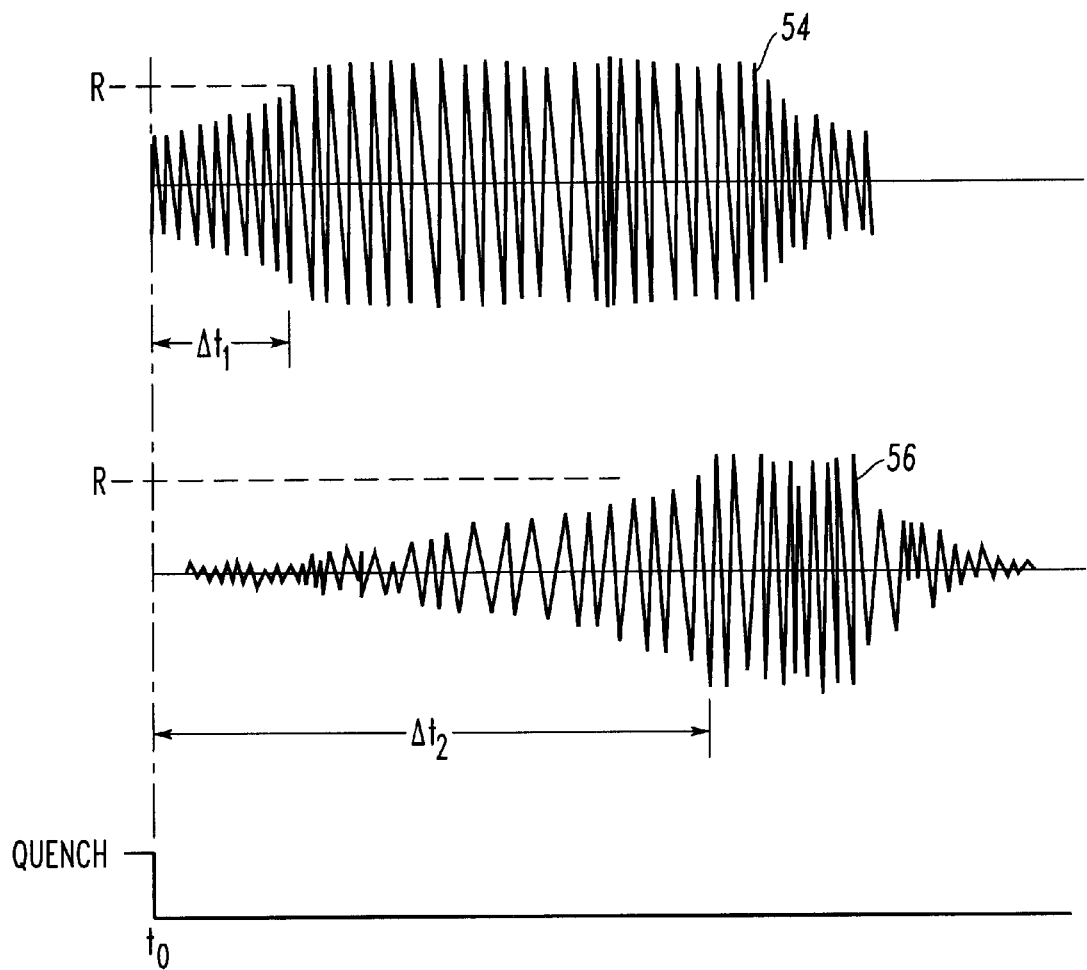
FIG. 4 shows RF waveforms to aid in an understanding of the operation of the modem.

At time $t_0$ in FIG. 4, the QUENCH signal state allows oscillations to commence. Curve 54 represents the buildup of oscillations from time $t_0$, wherein RF from the antenna is present, to some reference value R in a period of time $\Delta t_1$, due to the presence of the RF signal. In the absence of such RF signal, and as represented by curve 56, the oscillations will take a longer period of time, $\Delta t_2$, to build up and reach the magnitude R. The present invention utilizes these time differences to recover a signal, such as a binary bit pattern being received from another host.

Figure 5:
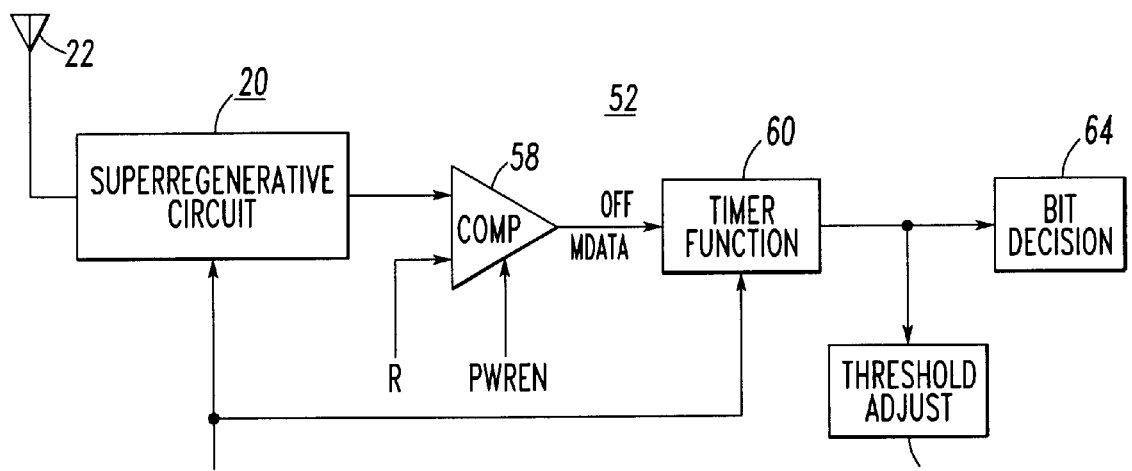
FIG. 5 is a block diagram illustrating a timing function.

As illustrated in the functional block diagram of FIG. 5, the output of superregenerative circuit 20 (from diode detector 50 in FIG. 3) is provided to a comparator 58 which is turned on during a receive operation by means of power enable signal PWREN. The comparator 58 also receives a comparator reference input of predetermined value R, and when the diode detector output achieves a value of R, the comparator will provide a corresponding output signal.

When the QUENCH signal goes low, or deasserts, a timer function in block 60 commences. An output signal MDATA from comparator 58, signifying that the reference level has been attained, shuts off the timer function and thus time values such as $\Delta t_1$, and $\Delta t_2$ (FIG. 4) are accumulated during a sampling cycle. These time samples can then be used to recover the transmitted signal. One example of such recovery of the transmitted signal is described in more detail in the aforementioned patent application.

As described therein, based upon the samples, a threshold value is established by threshold adjust function 62 and the individual timing count samples are compared with the established threshold. If a sample count is lower than the threshold, it represents a binary 1 whereas if a count is higher than the threshold it represents a binary 0 (for example $\Delta t_1$ representing a 1 in FIG. 4 is less than $\Delta t_2$ representing a 0).

Figure 6:
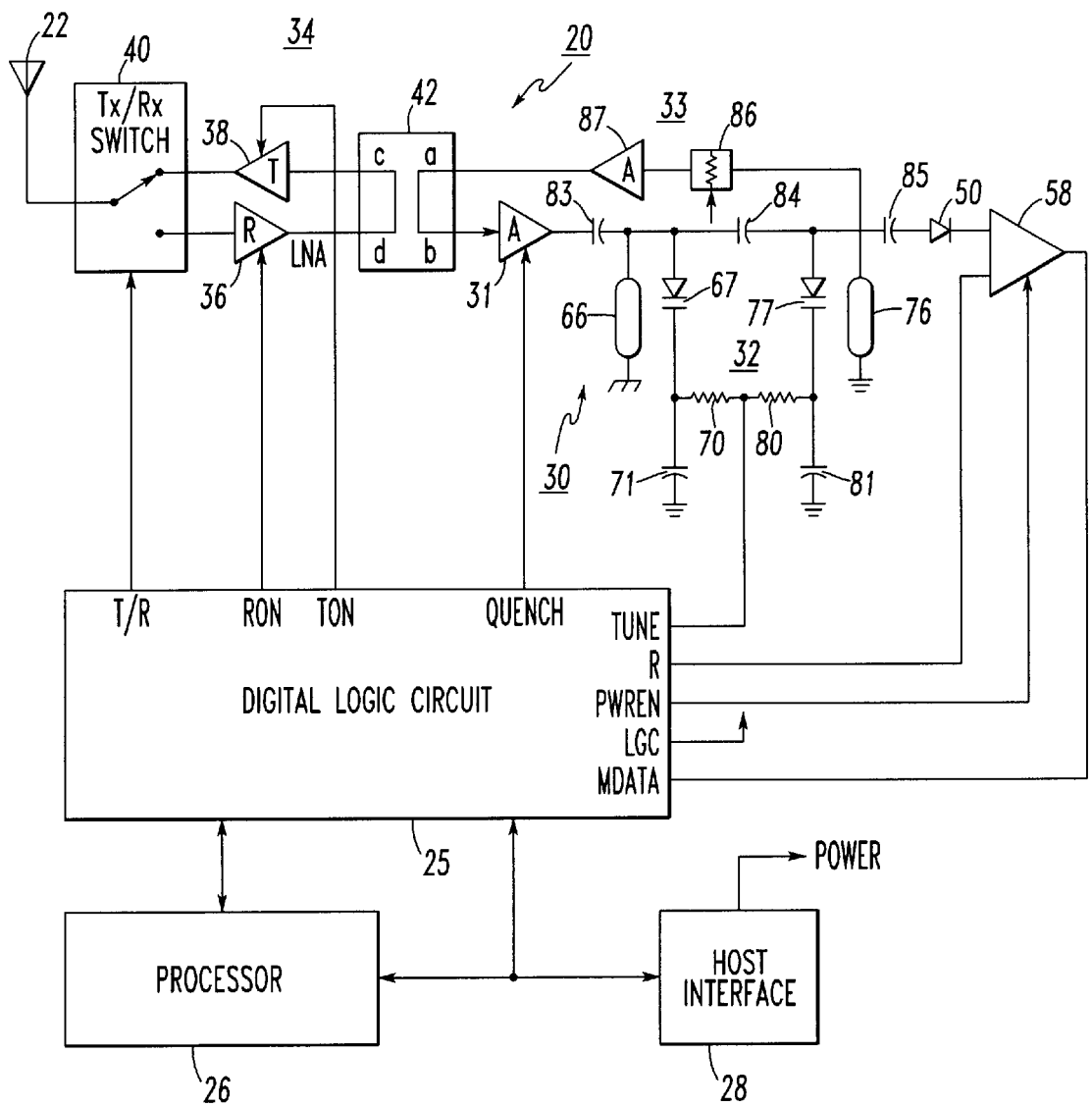
FIG. 6 illustrates the components of FIG. 2 in more detail.

The functions of blocks 60, 62 and 64 reside in the digital logic circuit 25, as illustrated in FIG. 6, which also shows the resonant circuit arrangement 32 in more detail. The arrangement includes a resonator assembly comprised of a ceramic resonator 66 which, in conjunction with varactor 67 determines the resonant, or operating frequency of the oscillator 30. The circuit is tuned by application of a predetermined voltage applied to the varactor 67, which sets its capacitance value. This tuning voltage is provided by the digital logic circuit 25 and is applied, via resistor 70 to the junction between varactor 67 and capacitor 71, which functions as a decoupling mechanism for any RF signals.

In order to improve the frequency selectivity, a second resonator 76 may be provided in conjunction with a second varactor 77, with digital logic circuit 25 supplying a tuning voltage, via resistor 80, to the junction between varactor 77 and capacitor 81. Coupling capacitors 83, 84 and 85 are provided between stages.

The rate at which oscillations build up is governed by the gain around the oscillator loop and the in-circuit Q of the resonators 66 and 76. In a rudimentary form, the feedback circuit 33 may be constituted, by a single conductor. However, it is desirable to regulate the rate at which oscillations build up in order to prevent normal circuit variations from causing the oscillator build up time to be outside the timing range for which the time measuring circuits were designed. This may be accomplished by the provision of controllable attenuator 86, as a component of feedback circuit 33, and having a coefficient of attenuation that may be varied by a loop gain control signal, LGC, provided by digital logic circuit 25.

Further, the feedback circuit 33 may additionally include a feedback amplifier 87 to boost oscillations and overcome any resonator losses as well as directional coupler 42 losses.

The antenna 22 which is used in both transmitting and receiving may be integrated with the superregenerative circuit 20 on a printed circuit board in a manner which can also accommodate the digital logic circuit 25, processor 26 and host interface 28, resulting in a modem which is about the size of a large postage stamp.

Figure 7A:
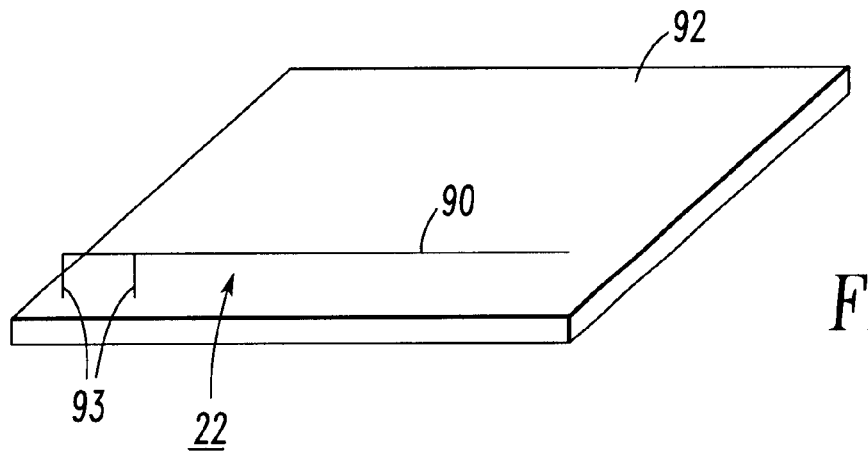
FIGS. 7A, 7B and 7C, illustrate antennas for the superregenerative circuit.
Figure 7B:
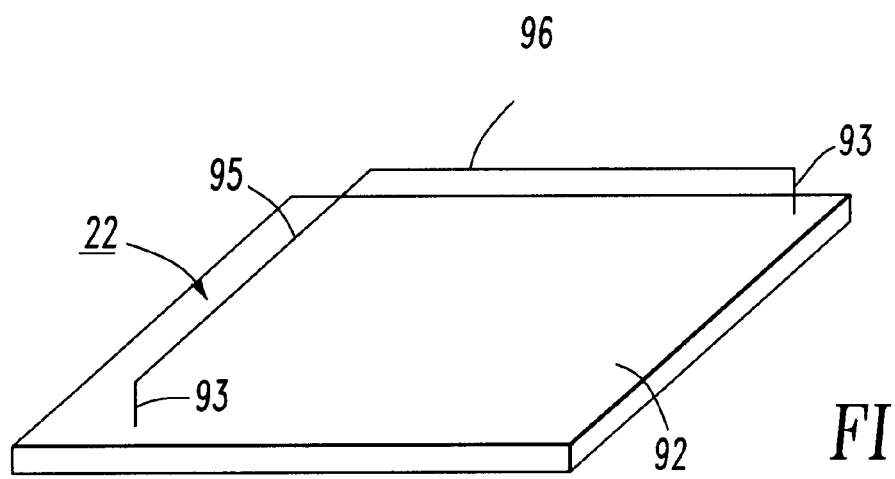

FIG. 7A illustrates one arrangement which utilizes a quarter wavelength rigid wire 90 spaced above the printed circuit board 92, to which the circuit elements of FIG. 2 would be attached. Rigid wire 90 is positioned by means of mounts 93. FIG. 7B is similar, however it illustrates rigid wires 95 and 96, forming a half wavelength design which takes up very little space on the printed circuit board 92. The antennas can be configured and fed several different ways, making them easy to integrate into the RF circuitry. Further, they are resonant, easy to adjust and can provide some preselection filtering.

Figure 7C:
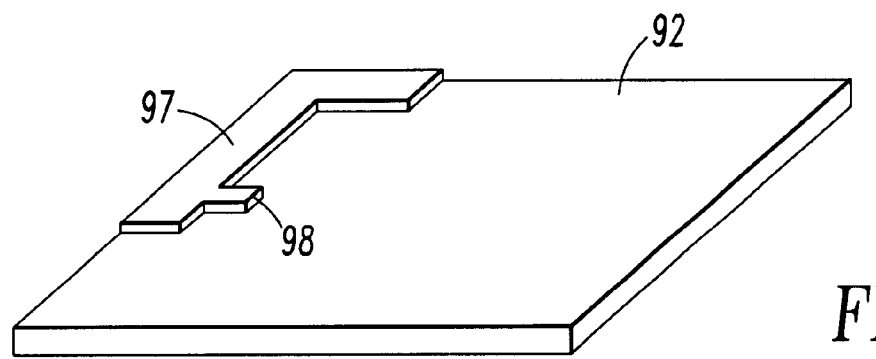

As an alternative, and as illustrated in FIG. 7C, a quarter wavelength (or half wavelength) antenna 97, having an antenna feed point 98, may be etched onto the surface of printed circuit board 92, or any intermediate layer thereof. When incorporated on or in the printed circuit board 92, any metalized area directly below or above the antenna 97 is removed.

With operation of the superregenerative circuit 20 as a receiver of binary signals, the received signal to be reproduced is sampled a number of times, for example, ten times for each bit, by operation of the digital logic circuit 25. Each sample of the RF waveform results in a corresponding time count, with a relatively low count being indicative of a binary 1 and a relatively high count being indicative of a binary 0.

This sampling of a single bit is illustrated in FIG. 8. Let it be assumed that transmission has been ongoing such that a threshold level T has been determined and that sync has been established. The waveform of FIG. 8a shows a Manchester encoded signal representing one bit, and that of FIG. 8b shows an idealized corresponding received RF signal. Every time the quench signal illustrated in FIG. 8c is deasserted, at times 100, oscillations build up in the superregenerative circuit 20 (FIGS. 3 and 4) and a timing count is initiated. When the energy build up exceeds the reference level R, as illustrated in the waveform of FIG. 8d, the comparator 58 will provide an output, FIG. 8e, to stop the timing function. The timer count build up is shown by waveform 8f, with the final count for each particular sample being represented by a level portion 102, some of which are below the threshold T (indicative of a 1) and others of which are above the Threshold (indicative of a 0). For ease of presentation, the recovered signal, FIG. 8g, is shown on the same timescale as the original signal of FIG. 8a. It is to be understood however, that there will be a small processing delay.

Figure 9A:
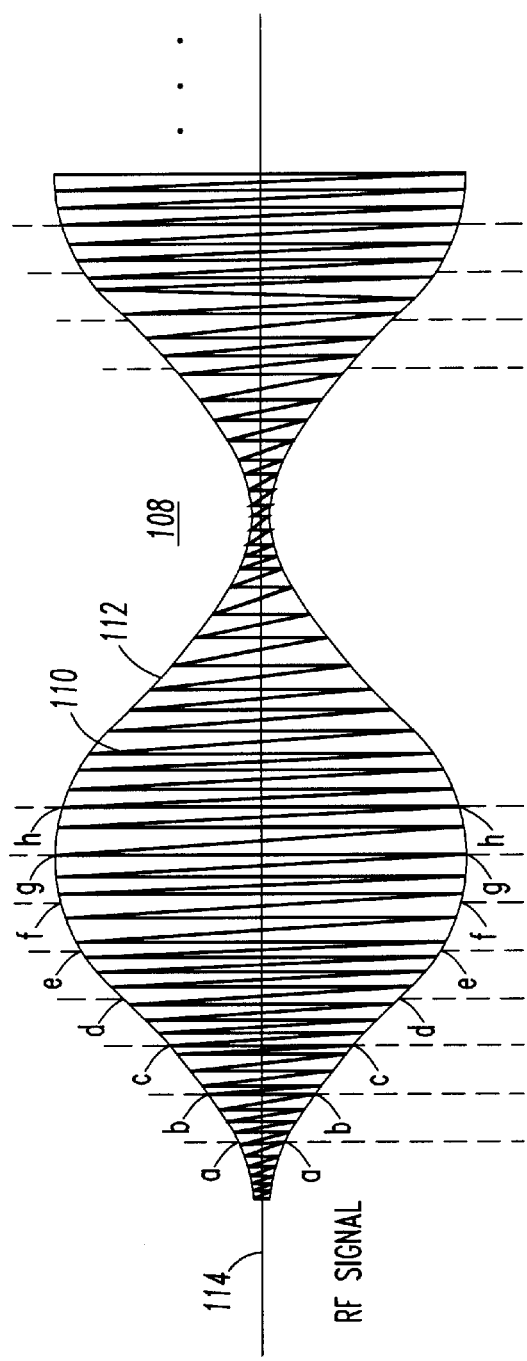
FIG. 9 illustrates the recovery of a non-binary signal.

In addition to the recovery of binary signals, the superregenerative receiver of the present invention is also operable to recover other types of signals such as illustrated in FIG. 9. In so doing, the circuitry may incorporate timers utilizing decrementing counters which are reset to some predetermined maximum value and thereafter counted down from that maximum value. By way of example, the signal of FIG. 9a is an amplitude modulated (AM) signal 108 comprised of a carrier wave 110 which is modulated by the sinusoidal signal 112, around a zero reference level 114.

Figure 9B:
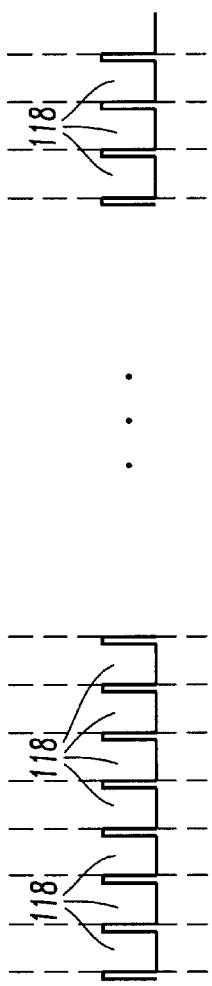
Figure 9C:
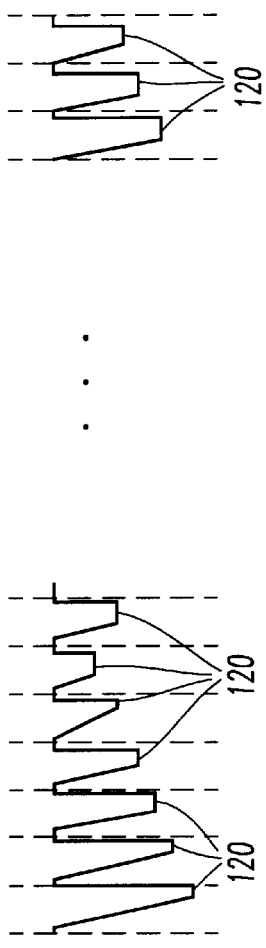

The quench signal of FIG. 9b serves to sample the am waveform during the periods 118 when the quench signal is low. The sampling rate of the quench signal should be at least 5 to 10 times the highest frequency of the modulating signal. In actual practice, the higher the sampling rate the greater will be the quality of the recovered signal.

As previously stated, as an alternative to the timer function described with respect to FIG. 8, the timer function may be constituted by a counter which counts down, instead of up. More particularly, at the start of each sample (when the quench signal goes low) a counter with some predetermined full count is turned on and begins to decrement. For each sample, when oscillations have built up to the predetermined reference level R, as previously described, such that the comparator 58 (FIG. 5) provides an output signal, this output signal will cause the counter to stop, place its then current count, as represented by levels 120 of FIG. 9c, into a memory and then reset.

Each count is indicative of the RF energy sampled, however, the energy is that contained between respective points aa, bb, cc etc., above and below the zero reference level of waveform 108. Accordingly, half the stored count may be used to reproduce the modulating signal 112. This may be accomplished by a conversion of the resulting digital count to an equivalent analog value such as by means including a digital-to-analog converter. The recovered waveform may be somewhat stepped, however this may be smoothed out by means of a filter operation.

Although the present invention has been described with a certain degree of particularity, it is to be understood that various substitutions and modifications may be made without departing from the spirit and scope of the invention as defined in the appended claims.

What is claimed is:

1. An RF superregenerative circuit operable in at least a receive mode of operation, comprising:
   (A) a superregenerative oscillator having an oscillator output, said oscillator including an amplifier having an input and an output, a resonant circuit arrangement connected to said output of said amplifier, and feedback means connecting said resonant circuit with said input of said amplifier;

(B) circuit means for controlling the oscillatory condition of said oscillator;

(C) antenna means;

(D) decoupling means connected in circuit between said antenna means and said oscillator and operable to minimize any RF energy radiated by said superregenerative circuit, via said antenna means, when in said receive mode of operation;

(E) utilization means connected to said output of said oscillator;

(F) said circuit means being operable to provide said oscillator with, periodic signals to allow oscillation thereof; and wherein (G) said utilization means includes timing circuitry operable to measure the time difference between the time that said circuit means allows oscillation and the time that the magnitude of said oscillations attain a predetermined reference level.

2. An RF superregenerative circuit operable in at least a receive mode of operation, comprising:

(A) a superregenerative oscillator having an oscillator output, said oscillator including an amplifier having an input and an output, a resonant circuit arrangement connected to said output of said amplifier, and feedback means connecting said resonant circuit with said input of said amplifier;

(B) circuit means for controlling the oscillatory condition of said oscillator;

(C) antenna means;

(D) decoupling means connected in circuit between said antenna means and said oscillator and operable to minimize any RF energy radiated by said superregenerative circuit, via said antenna means, when in said receive mode of operation; and (E) utilization means connected to said output of said oscillator;

(F) said superregenerative circuit being additionally operable in a transmit mode of operation; and wherein (G) said decoupling means includes a) a receive path, b) a transmit path and c) a 4-port directional coupler;

(H) one port of said directional coupler being connected to staid feedback means, another port of said directional coupler being connected to said amplifier input, another port of said directional coupler being connected to said transmit path and the fourth port of said directional coupler being connected to said receive path.

3. A superregenerative circuit according to claim 2 wherein:

(A) said receive path includes a receive amplifier.

4. A superregenerative circuit according to claim 2 wherein:

(A) said transmit path includes a transmit amplifier.

5. A superregenerative circuit according to claim 2 wherein:

(A) said receive path includes a receive amplifier;

(B) said transmit path includes a transmit amplifier; and which includes (C) a transmit/receive switch operable to electively connect either said receive path or said transmit path to said antenna means.

6. A superregenerative circuit according to claim 5 wherein:

(A) said antenna means is a single antenna which is used for both receiving and transmitting.

7. A superregenerative circuit according to claim 2 which includes:

(A) a printed circuit board to which said oscillator, circuit means, and decoupling means are attached;

(B) said antenna means being constituted by a wire positioned above said printed circuit board, and electrically connected to said decoupling means.

8. A superregenerative circuit according to claim 2 which includes:

(A) a printed circuit board to which said oscillator, circuit means, and decoupling means are attached;

(B) said antenna means being integral with said printed circuit board, and electrically connected to said decoupling means.

* * * * *